United States Patent
Volz

(10) Patent No.: US 7,237,161 B2
(45) Date of Patent: Jun. 26, 2007

(54) REMOTE INTEGRATED CIRCUIT TESTING METHOD AND APPARATUS

(75) Inventor: Aaron M. Volz, Ft. Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 268 days.

(21) Appl. No.: 11/094,455

(22) Filed: Mar. 30, 2005

(65) Prior Publication Data
US 2006/0242499 A1   Oct. 26, 2006

(51) Int. Cl.
*G01R 31/28* (2006.01)
(52) U.S. Cl. ............... 714/724; 714/30
(58) Field of Classification Search ........... 714/713, 714/725, 724, 30; 379/22.02; 370/250
See application file for complete search history.

(56) References Cited

U.S. PATENT DOCUMENTS

| | | | | |
|---|---|---|---|---|
| 4,517,512 A | * | 5/1985 | Petrich et al. | 714/724 |
| 4,788,708 A | * | 11/1988 | Hendrix | 379/22.02 |
| 4,980,887 A | * | 12/1990 | Dively et al. | 714/713 |
| 5,027,343 A | * | 6/1991 | Chan et al. | 370/250 |
| 6,275,962 B1 | * | 8/2001 | Fuller et al. | 714/724 |
| 6,393,591 B1 | * | 5/2002 | Jenkins et al. | 714/725 |

* cited by examiner

*Primary Examiner*—David Ton

(57) ABSTRACT

A method and system for remotely testing an integrated circuit installed in an integrated circuit system is presented. The integrated circuit is equipped with test structures for testing functional blocks within the integrated circuit, and a test access mechanism configured to receive test vectors for controlling the test structures. Test vectors are applied, via the parallel port of a remote computer and parallel cable, to pins of the parallel port of the integrated circuit system, which are connected to the signal ports of the test access mechanism implemented in the integrated circuit of interest, thereby allowing remote testing of the integrated circuit while the integrated circuit is installed in its native system.

20 Claims, 6 Drawing Sheets

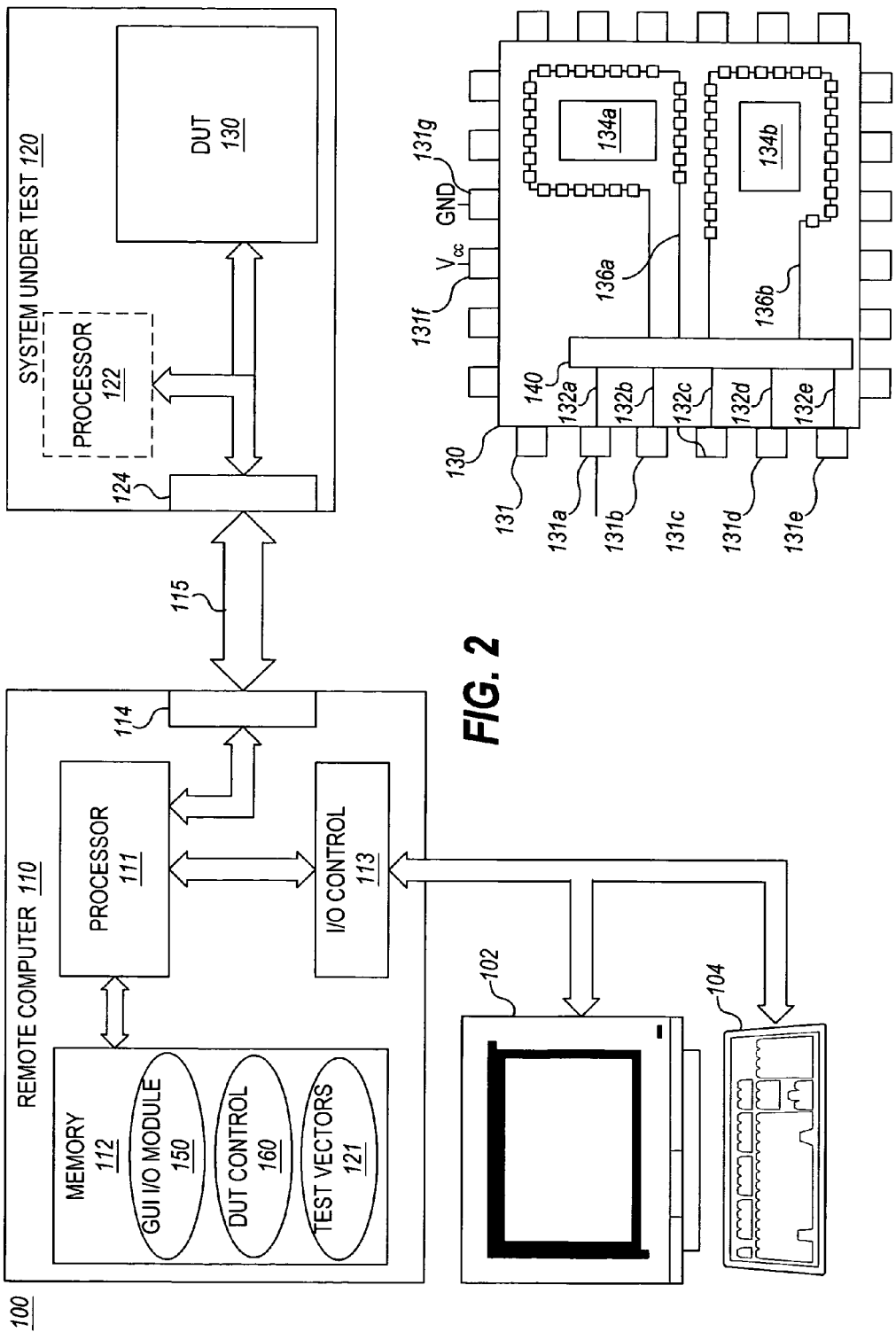

REMOTE INTEGRATED CIRCUIT TESTING METHOD AND APPARATUS

BACKGROUND OF THE INVENTION

Integrated circuit testing is critical at both the design level to confirm proper operation of a given design and at the manufacturing level for ensuring a given integrated circuit (IC) meets all manufacturing specifications prior to shipment. In response to increasing complexity of ICs and consumer demand for high quality and low failure rate, the integrated circuit manufacturing industry has developed large, complex, and expensive testers for integrated circuits, integrated circuit assemblies, and printed circuit board assemblies for performing these tests. These sophisticated testers require knowledgeable engineers to develop thorough suites of tests that test many aspects of the IC, including continuity testing, functional testing, current testing, etc. As a result, integrated circuit manufacturers typically employ dedicated test engineers to develop these test suites. As a further result, there is typically a high degree of reliability of integrated circuits that pass the tests.

However, once the IC is assembled into a larger system and installed at a customer's site, diagnostic testing of the IC in the face of failures of the larger system can be difficult. For starters, access to the sophisticated testers that can determine whether or not the IC is defective and/or whether and what repairs might be performed to overcome the identified problems is not available without physically removing the IC from the system and sent to a remote test site, for example the manufacturer, for diagnostics. However, even when the IC is tested using a sophisticated tester and using tests designed by the test engineers for manufacturing test of the IC, certain defects may not be recognizable because the circumstances which lead to the defective operation of the system may not be regenerated by the manufacturing tests—in other words, the defective operation of the IC may only be regenerated by operation within the system that the IC is installed in. Furthermore, even when the IC is easily removable, removal of the IC from the system debilitates the system it was removed from for days, which in some circumstances can be quite costly to the customer. Depending on various business-related factors, companies responsible for proper operability of the IC within the system may send field engineers to the customer site for diagnostics, and/or may replace the IC within the customer's system. Both of these solutions can be very costly to one or both of the responsible company and customer in terms of travel costs, engineering time, cost of replacement of the IC, and system down-time. Furthermore, simple replacement of the IC may not provide a solution to the problem if the cause of the problem is a result of a system state that is outside of the IC specifications.

Within the manufacturing test industry, present trends in improving manufacturing testability of integrated circuits include Design for Test (DFT) and Concurrent Test (CCT) techniques. DFT techniques are general design procedures, practices and rules that fit or link circuit testability to the development of manufacturing environments. DFT requires the addition of specialized test hardware on the integrated circuit itself that is independent of the circuitry implementing the intended functionality of the integrated circuit. Traditional DFT techniques include Scan Techniques (for example, using the IEEE 1149.1 Boundary Scan and Joint Test Access Standard (JTAG) protocols), Built In Self Test (BIST), and IDDQ tests.

During testing, the integrated circuit is placed into a test mode that is different from its normal operating mode. When in test mode, test data is routed to the functional blocks under the control of the DFT specialized test hardware rather than from external integrated circuit pads (i.e., the DFT hardware replaces the I/O pins for data/address/control I/O signals). The DFT hardware applies test data to the block under test, and receives return results. Analysis of the result data may be performed by the DFT hardware, or may be output to an external tester device for off-line analysis.

DFT hardware is typically designed to reduce the number of full functional test channels (and therefore physical test probes) required for test access. This is achieved using various techniques. In Scan testing, a scan storage cell is implemented for each input and output of interest of the functional circuit block under test. The scan storage cells are connected together in a serial chain, which is connected at an input to a scan-in port of the integrated circuit and connected at an output a scan-out port of the integrated circuit.

DFT designs typically feature centralized or decentralized Test Access Mechanisms (TAM) through which data passes. In a traditional DFT test, these TAMs receive test data from integrated circuit pins or pads connected directly to tester resources. Test data is loaded into the scan chains via a serial scan load operation, for example using the IEEE 1149.1 Boundary Scan and JTAG protocols, incorporated herein by reference for all that it teaches. The scan storage cells are multiplexed with the data path coming from another functional circuit block or from the integrated circuit I/O pads used during normal operation of the integrated circuit. In this regard, when the integrated circuit is placed in a test mode, data is applied to the inputs and outputs of interest of the functional circuit block under test from respective scan storage cells, and when the integrated circuit is placed in a normal operating mode, data is applied to the inputs and outputs of the functional circuit block under test via the normal data path (typically from an I/O pin or an I/O signal from another functional block on the integrated circuit). In the standard JTAG protocol, data is loaded into the scan chains via a Test Data In (TDI) serial input port, and data is output from the scan chains via a Test Data Out (TDO) serial output port. Accordingly, access to any number of I/O ports within the integrated circuit is made available via only five pads of the integrated circuit. These pads include pads designated for Test Mode Select (TMS) for setting the control operation of the JTAG circuitry, Test Data In (TDI) for inputting data to the scan chains, Test Data Out (TDO) for receiving data output from the scan chains, Test Clock (TCK) for clocking JTAG state machine and the transfer of data within the scan chains, and Test Reset (TRST) for initializing the JTAG state machine and scan chain data to an initial known state.

In the IEEE 1149.1 Boundary Scan and JTAG protocols, data is applied serially to the integrated circuit, and therefore requires more time to execute tests. Accordingly, concurrent testing (CCT) and compression techniques may be implemented to assist in reducing test time. CCT techniques allow independent and concurrent testing (i.e., testing in parallel) of independent functional blocks on the integrated circuit. CCT techniques rely on partitioning the functionality of the overall intended integrated circuit functionality into independently testable functional blocks during the design phase.

Accordingly, it would be desirable to overcome the problems of the prior art described above, by providing an integrated circuit testing technique that reduces the required integrated circuit test pin/pad count, decreases test time, and is economical.

SUMMARY OF THE INVENTION

The present invention is a method and apparatus for allowing testing and/or controlling of integrated circuits equipped with a test access mechanism from a remote computer. The invention allows test and/or control of the integrated circuit of interest without removing the integrated circuit from its native system. In the preferred embodiment, control signals are passed from the remote computer to the system containing the integrated circuit of interest (i.e., the native system) by way of a parallel cable. Preferably, the remote computer executes a graphical user interface that allows a user to configure the pins of the parallel port on which control signals are to be output. The GUI allows the user to input test vectors to be applied to the integrated circuit of interest. Control software that interfaces with the I/O portion the GUI software writes the test vectors to the configured pins of the parallel port. The system containing the integrated circuit of interest also includes a parallel port. Control signals applied by the remote computer are received on pins of the native system parallel port, which are electrically connected to corresponding pads of the integrated circuit of interest. In the preferred embodiment, the test access mechanism of the integrated circuit of interest is implemented as a Test Access Port (TAP) implementing the IEEE 1149.1 protocol, and the control signals corresponding to signals representing the Test Mode Select (TMS) signal, the Test Data In (TDS) signal, the Test Data Out (TDO) signal, the Test Clock (TCK) signal, and the Test Reset (TRST) signal.

Because the invention allows remote control and/or testing of the integrated circuit of interest without having to remove the integrated circuit of interest from its native system, the integrated circuit of interest may be tested without the use of a large industrial ICT tester with minimal physical probe contact (i.e., without requiring the use of a dedicated integrated circuit tester), and further allows testing during multiple phases of the life cycle of the integrated circuit. In addition, the invention may be adapted to allow testing of multiple integrated circuits of the same design in parallel.

The advantages attendant with the present invention are numerous. Through the parallel port of the system in which the integrated circuit of interest is installed, a test station computer may be connected to the chip's DFT structures via the test access mechanism (e.g., TAP implemented in accordance with the IEEE 1149.1 protocol) of the integrated circuit of interest. Data can then be applied to the integrated circuit's DFT structures from the remote computer without connecting any digital tester resources to the device under test (DUT) and without removing the integrated circuit of interest from its native system. Results data generated by the integrated circuit of interest can be returned to the remote computer over the same parallel cable communications channel. To this end, manufacturing and diagnostic tests generated by the IC manufacturer or test engineers can be applied to the IC to determine whether the IC is operating properly within the system to therefore determine whether a fault observed in the native system is caused by the IC. Furthermore, if the tests determine that the IC is not operating properly, the results of the test can be analyzed to identify the fault in the IC to assist in determining whether any repairs can be made without removing the IC from its native system.

The invention significantly reduces costs associated with field testing and debug of ASICs. In this regard, the integrated circuits of interest need not be removed from its system and returned to the manufacturer for testing in an industrial ICT tester. Additionally, because the invention requires only a software application and compatible communications interfaces in both the native system and remote computer (for example, the ubiquitous parallel ports standardly implemented in today's computer systems), and that the native system communications interface connects to test access mechanism signal pads of the integrated circuit of interest, tests and control scripts may be executed by site operators (with suitable instruction via phone conversations with the ASIC's troubleshooting engineers, website troubleshooting instructions, written manuals, etc.). This reduces the need for the manufacturers or other responsible parties to send field representatives to the site experiencing trouble.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 2 is a schematic block diagram of a preferred embodiment of a system implemented in accordance with the invention;

FIG. 3 is a schematic block diagram of an example integrated circuit to be tested by the system of the invention;

DETAILED DESCRIPTION

Figure 1:
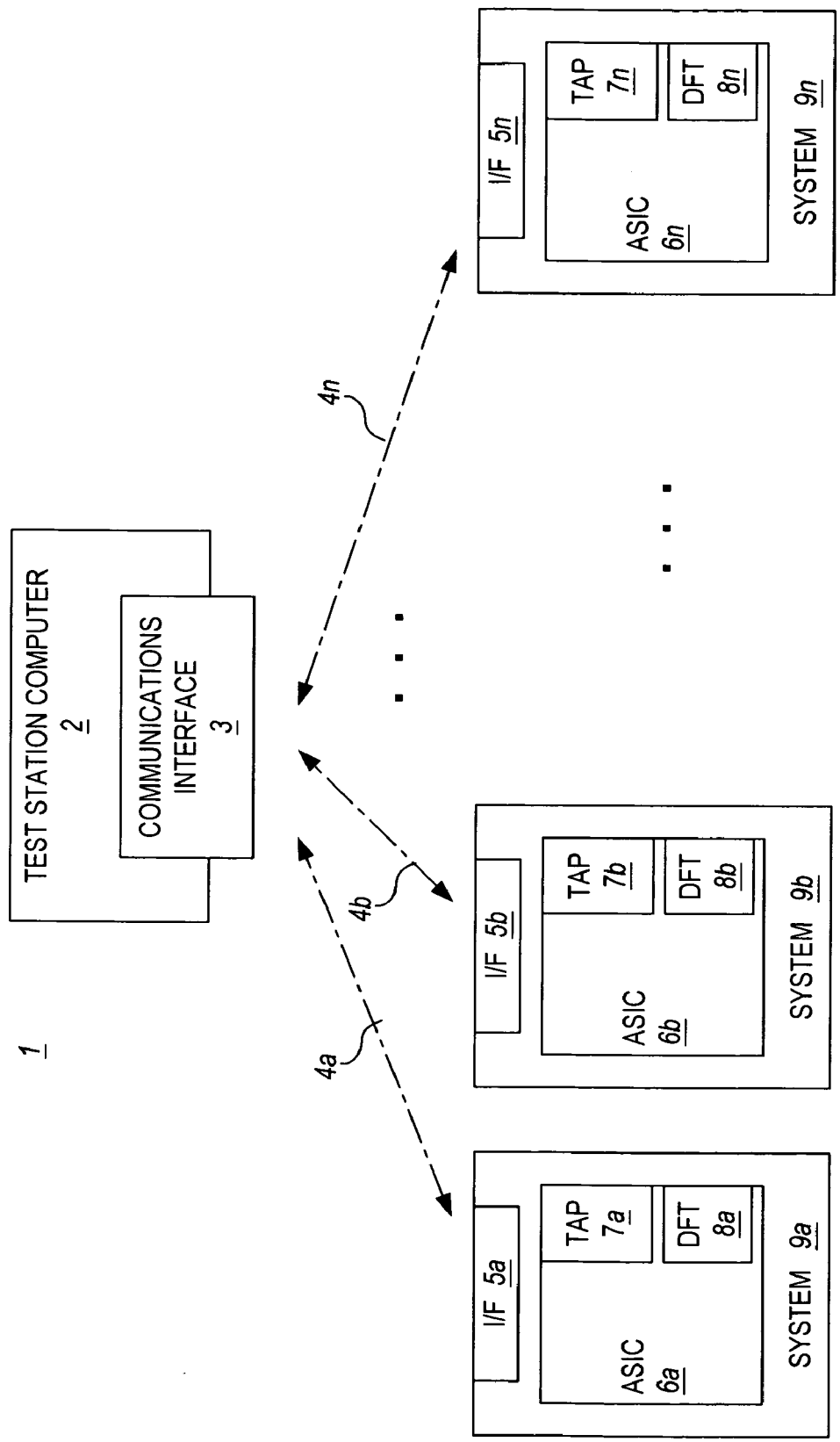
FIG. 1 is a high-level system block diagram of an integrated circuit test system implemented in accordance with the invention.

Turning now to the drawings, FIG. 1 is a high-level system diagram of a system 1 illustrating the general concept of the invention. As illustrated, according to the present invention, a computer 2 equipped with an external communications interface 3 (e.g., a parallel output port, a wired network interface, a wireless internet protocol interface) is configured to communicate over communication channels 4a, 4b, ..., 4n with one or more respective systems 9a, 9b, ..., 9n, each equipped with a communications interface 5a, 5b, ..., 5n that is compatible with the communications interface 3 of computer 2. Each of the one or more systems 9a, 9b, ..., 9n also includes a device under test (DUT) 6a, 6b, ..., 6n (e.g. ASICs) that is equipped with a test access mechanism (TAM) 7a, 7b, ..., 7n such as a Test Access Port (TAP) implemented in accordance with the IEEE 1149.1 standard. Each TAM 7a, 7b, . . . , 7n is connected to or is connectable to one or more design-for-test (DFT) structures 8a, 8b, . . . , 8n that are configured to apply data to and/or receive data from nodes of various functional blocks (not shown) within the respective DUTs 6a, 6b, . . . , 6n. In the preferred embodiment, the DUTs 6a, 6b, . . . , 6n are preferably integrated circuits such as Application Specific Integrated Circuits (ASICs), although the DUTs may also be integrated circuit wafers, packaged integrated chips, printed circuit boards, etc., as long as they include some form of DFT functionality that receives digital test data and outputs digital output data via a test access mechanism 7a, 7b, . . . , 7n.

In operation, the test station 2 sends control signals and/or test vectors over the communication channels 4a, 4b, . . . , 4n to the system(s) 9a, 9b, . . . , 9n, to be applied to the test access mechanisms 7a, 7b, . . . , 7n of the DUTs 6a, 6b, . . . , 6n of these systems 9a, 9b, . . . , 9n. The received control signals and/or test vectors are applied to the test access mechanism(s) 7a, 7b, . . . , 7n which control the DFTs 8a, 8b, . . . , 8n to apply data to predefined nodes of the DUTs 6a, 6b, . . . , 6n. Output data received by the DFTs 8a, 8b, . . . , 8n is transferred out via the test access mechanisms 7a, 7b, . . . , 7n over the communication channels 3a, 3b, . . . , 3n to the test station 2 under control of signals generated by the test station 2.

If the communications interface/protocol used to implement the communication interface 2 and communication channels 3a, 3b, . . . , 3n supports simultaneous transmission of data to multiple devices, for example a wireless IP protocol that supports transmission of data to multiple IP addresses, multiple DUTs 6a, 6b, . . . , 6n may be tested/controlled in parallel.

FIG. 2 is a schematic block diagram of a preferred embodiment of a system 100 implemented in accordance with the invention. As illustrated therein, the system 100 is configured with a remote computer 110 communicating with a system 120 (hereinafter "system under test" 120) via a parallel cable 115. The remote computer 110 is configured with a processor 111, a memory 112, a parallel port 114, and input/output (I/O) control 113 which interfaces with a monitor 102 and keyboard 104. The processor 111 executes program instructions residing in memory 112, which in the preferred embodiment takes the form of a graphical user interface (GUI) I/O module 150 and a device under test (DUT) module 160.

The system under test 120 includes an integrated circuit device under test (DUT) 130 that can be tested and/or controlled by the remote computer 110 as hereinafter described. In addition to the DUT 130, the system under test 120 includes at least a parallel port 124 and may also include other system components, for example a system processor 122.

Figure 4:
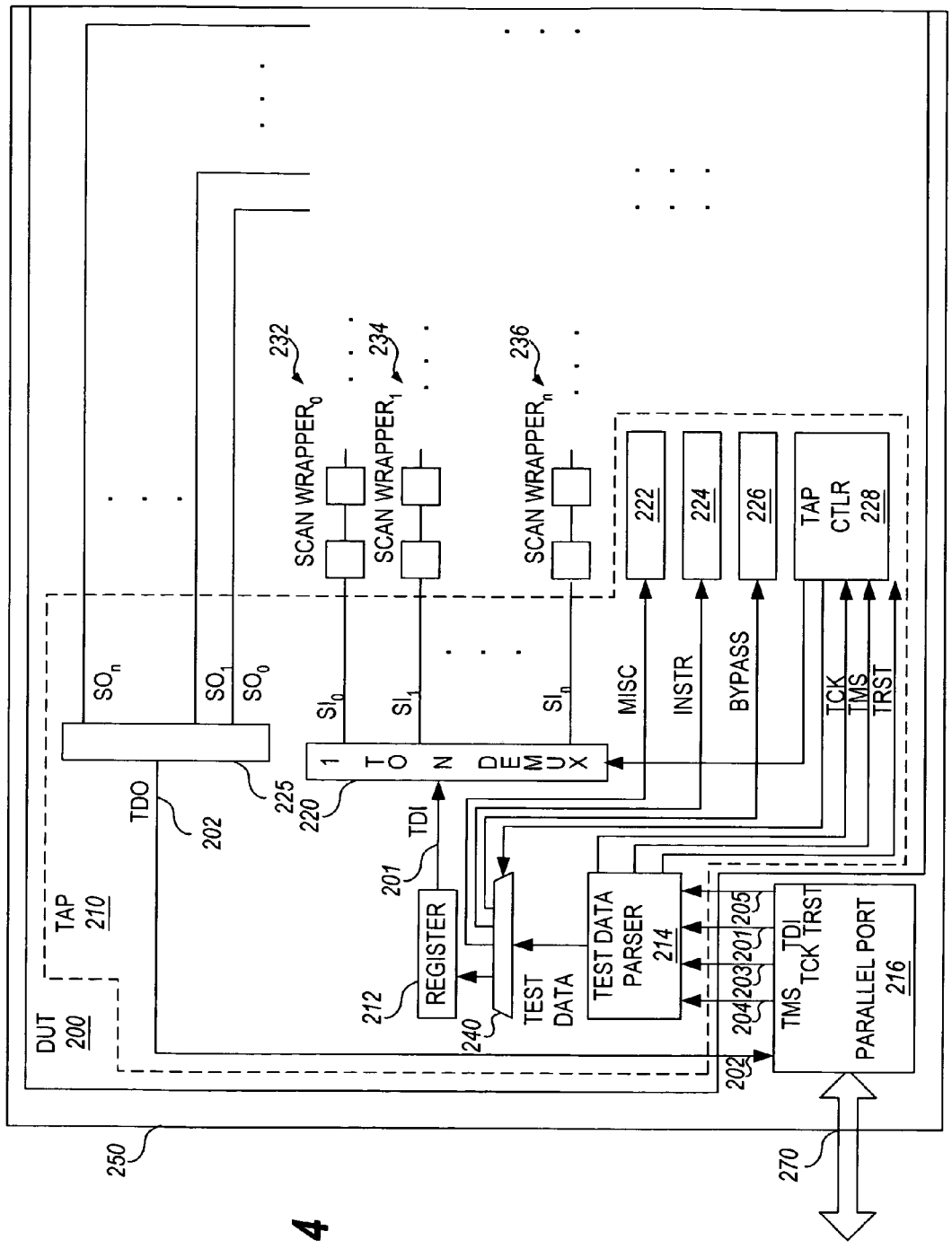
FIG. 4 is a more detailed schematic diagram of an example integrated circuit test that may be tested by the system of the invention.

FIG. 3 is a schematic block diagram of an example DUT 130 implemented in accordance with the invention. As shown, the DUT 130 includes one or more digital blocks 134a, 134b, each having associated DFT hardware 136a, 136b (for example scan wrappers, an example of which is shown in FIG. 4 and discussed hereinafter) that facilitates testing of the digital blocks 134a, 134b. In the preferred embodiment, the DFT hardware 136a, 136b includes a set of scan wrappers comprising a number of data cells connected to nodes of the respective digital blocks. In a test mode, data contained in the scan wrapper cells is applied to the nodes of the digital blocks rather than input via the normal data path.

The chip 130 also includes a Test Access Mechanism (TAM) 140 for routing test data to the DFT structures. The TAM 140 communicates with the outside world via a set of input and/or output signal ports 141a, 141b, 141c, 141d, 141e. The TAM signal ports 141a, 141b, 141c, 141d, 141e are connected via lines 132a, 132b, 132c, 132d, 132e to corresponding DUT input/output pads 131a, 131b, 131c, 131d, 131e, to receive test vectors 121 thereby allowing access to the TAM 140 by the outside world (i.e., outside the DUT 130). As will be described in more detail hereinafter, the TAM 140 implements a TAP accordance to the IEEE 1149.1 protocol, and the DUT pads 131a, 131b, 131c, 131d, 131e, the TAM signal ports 141a, 141b, 141c, 141d, 141e, and connecting lines 132a, 132b, 132c, 132d, 132e carry bits of test vectors 121 respectively corresponding to a test mode select (TMS) signal, a test data in (TDI) signal, a test data out (TDO) signal, a test clock (TCK) signal, and a test reset (TRST) signal.

Outside the DUT 130, the DUT pads 131a, 131b, 131c, 131d, 131e are connected, for example via printed circuit board (PCB) traces 125a, 125b, 125c, 125d, 125e, to predetermined pins 124a, 124b, 124c, 124d, 124e of the parallel port 124 of the system under test 120. Thus, test vectors 121 received on the pins 124a, 124b, 124c, 124d, 124e of the parallel port 124 are applied to the DUT pads 131a, 131b, 131c, 131d, 131e of the DUT 130, and consequently applied to the TAM signal ports 141a, 141b, 141c, 141d, 141e of the TAM 140. Conversely, output vectors from the TAM 140 are transferred from the output TAM signal port(s) to the corresponding respective pin(s) of the parallel port 124.

The remote computer 110 executes the GUI I/O module 150 which obtains user input and activates control functions in the DUT control module 160 based on user input. The remote computer 110 executes the DUT control module 160 which writes test vectors 121 on predetermined pins 114a, 114b, 114c, 114d, 114e of the parallel port 114 that are connected via the parallel cable 115 to corresponding predetermined pins 124a, 124b, 124c, 124d, 124e of the parallel port 124 of the system under test 120. The remote computer 110 also executes the DUT control module 160 which receives the test vectors 121 on predetermined input pins 114a, 114b, 114c, 114d, 114e of the parallel port 114 that are connected via the parallel cable 115 to corresponding predetermined output pins 124a, 124b, 124c, 124d, 124e of the parallel port 124 of the system under test 120.

Referring now to FIG. 4, a more detailed implementation diagram of a DUT 250 that may implement the DUT 130 of FIG. 3 is shown. As illustrated therein, the DUT 250 includes a TAP 210 implemented according to standard IEEE 1149.1 JTAG standard with one TDI port 201 and one TDO port 202.

Test instructions and test data are serially input to the DUT 200 via the TDI port 201. Test results and status information are returned from the DUT 200 via the TDO port 202. The TAM 210 includes a test access port (TAP) controller 228 that receives the test clock (TCK) 203 signal (as applied by the test vectors at the TAM TCK signal port) and a test mode select (TMS) 204 signal (as applied by the test vectors at the TAM TMS signal port). The TAP controller 228 controls the interpretation of data received on the TDI port 201. The TAP controller 228 is a synchronous finite-state machine that is clocked by the TCK signal 203 and processes the TMS signal 204 to determine the operations of data flow through one or more of the instruction register 224, bypass register 226, miscellaneous register 222, and scan wrappers 232, 234, 236. The TMS signal 204 determines the operation of the TAM 210. Certain sequences of 0s and 1s place the TAM 210 in various modes such a normal mode (i.e., the normal operating mode of the chip where the DFT circuitry is transparent to the application logic of the integrated circuit), a scan mode (where the input of one more scan chains are connected to the TDI port 201 and the output of one or more scan chains 232, 234, 236 are connected to the TDO port 202), a capture mode (where data is serially loaded into one or more of the instruction register 224, the bypass register 226, miscellaneous register 222, or one or more of the scan chains 232, 234, 236), and an update mode (where the data stored in the scan storage cells of the scan chains 232, 234, 236 are output from the respective scan storage cell outputs).

The DUT 200 includes a parallel port 216 that receives test vectors over a parallel cable 270. The pins of the parallel port 216 that receive the TAP signals from the test station are connected to the TAP signal ports. The TCK signal 203 and TMS signal 204 are input to the TAP controller 228. The TCK signal 203 steps the TAP state machine implemented in the controller 228, and the TMS signal 204 (in combination with the currents state) determines the next state of the state machine. The test data parser 214 also extracts test data bytes, words, or blocks, which are passed, in parallel, to a multiplexer 240 which is connected at an output to each of a scan-in register 212, instruction register 224, miscellaneous register 222, and bypass register 226. The TAP controller 228 controls the output of the multiplexer 240. The output of the register 212 is connected to the input of a 1-to-N demultiplexer, which passes the register contents on to a selected one of the scan input ports of Scan Wrappers 232, 234, 236, under the control of the TAP controller 228. Instructions, bypass data, or miscellaneous data is sent to one of either the TAM miscellaneous register 222, instruction register 224, bypass register 226. In this embodiment, test data is shifted serially into the selected register or scan wrapper, according to standard boundary scan convention. However, if the scan wrappers 232,234, 236 support parallel load, the selected register or scan wrapper may be loaded from the register 212 in parallel.

The TAP controller 228 controls application of data from the scan storage cells of the respective scan wrappers 232, 234, 236 to respective functional blocks (not shown in FIG. 4).

Test data results are shifted serially out from the Scan Wrappers 232, 234, 236 synchronous with the test clock signal TCK 203 onto the TDO signal port of the TAP 210, and hence onto the designated pin of the parallel port 216 of the system under test 200.

At the test station, the DUT control module 160 receives the test results from the DUT 250, extracts the test results data, and preferably passes it on to a test results analyzer for analysis. In the alternative, the test results data are stored for later analysis, or transmitted to another device for analysis.

Figure 5A:
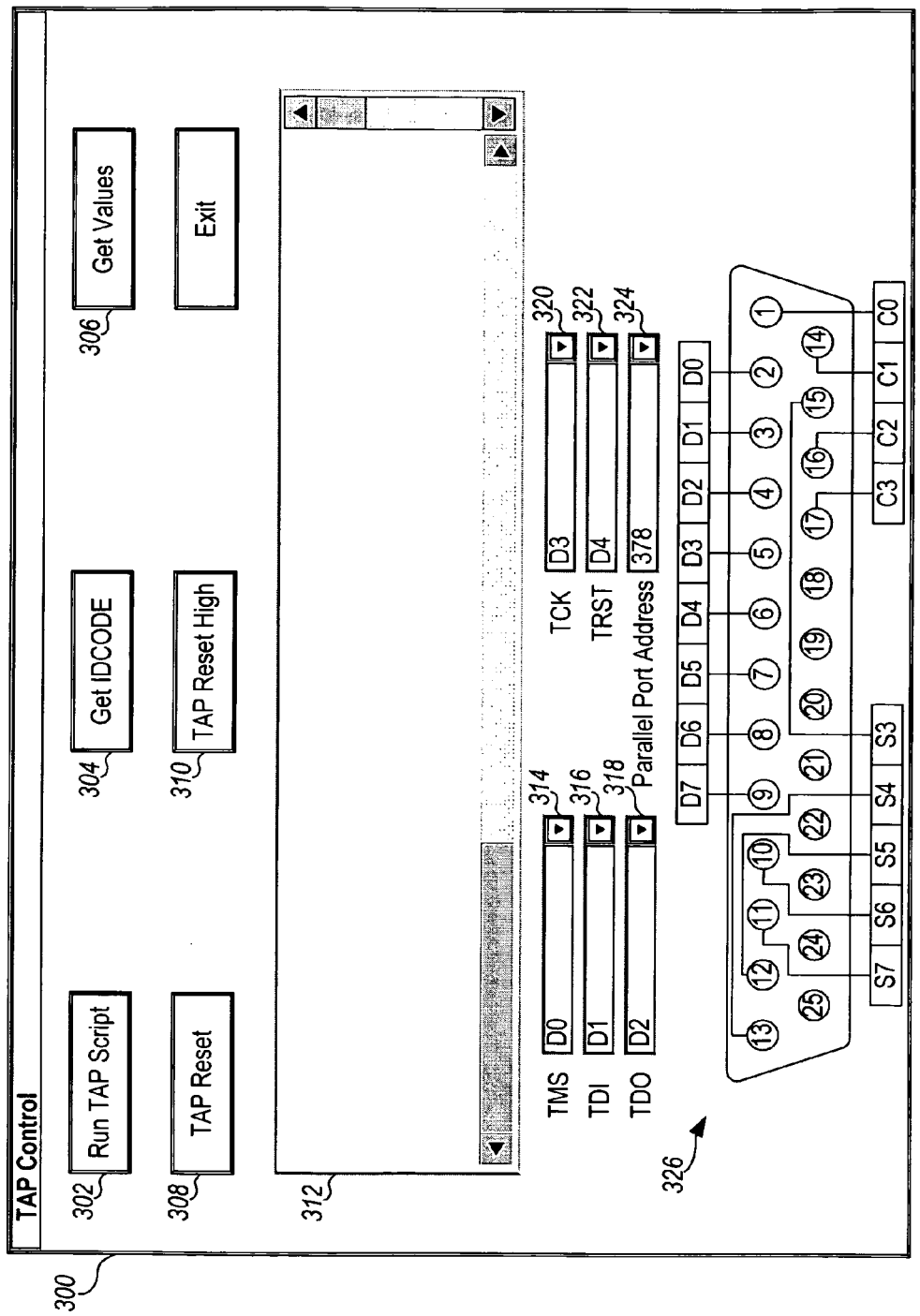
FIG. 5A is an example of a GUI display implemented in accordance with a preferred embodiment of the invention.

FIG. 5A is an example of a GUI display 300 implemented in accordance with a preferred embodiment of the invention. As illustrated, the GUI 300 displays a number of buttons, including Run_Tap_Script 302, Get_ID_Code 304, Get_Values 306, TAP_Reset 308, and TAP_Reset_High 310 buttons. For convenience of the user and for accommodating parallel ports with differing pin definitions, the GUI display 300 may also display a pin-out map 326 of the parallel port of the system under test, and provide respective drop-down selectable pin lists 314, 316, 318, 320, 322 to allow the user to configure the pin of the parallel port on which to write each of the corresponding signals TMS, TDI, TCK, TDO, and TRST. The GUI 300 my also provide a box 324 for specifying the parallel port address on which the test vectors should be written.

Figure 5B:
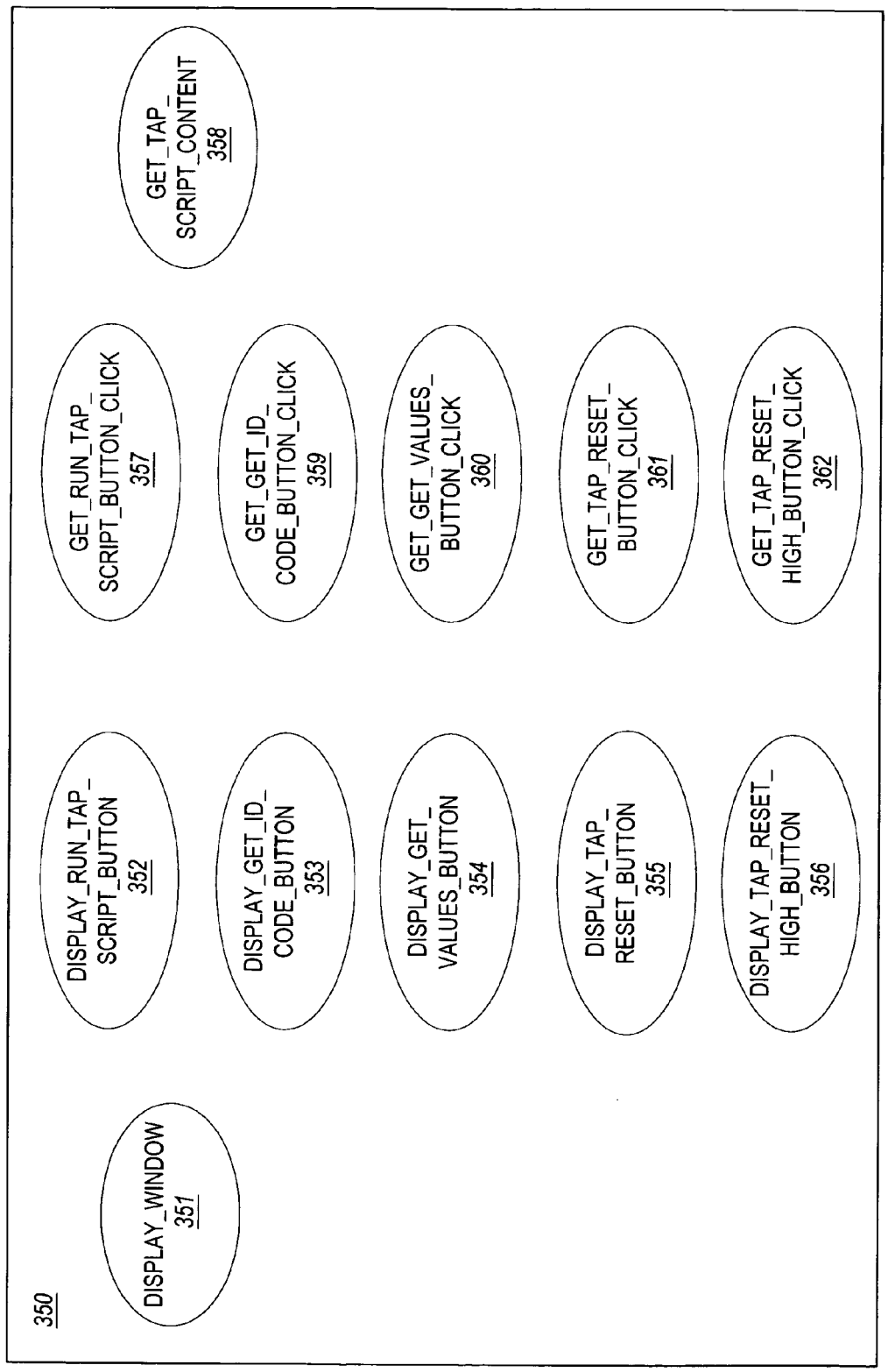
FIG. 5B is a software layout diagram illustrating a GUI I/O module that may generate the GUI display of FIG. 5A.
Figure 5C:
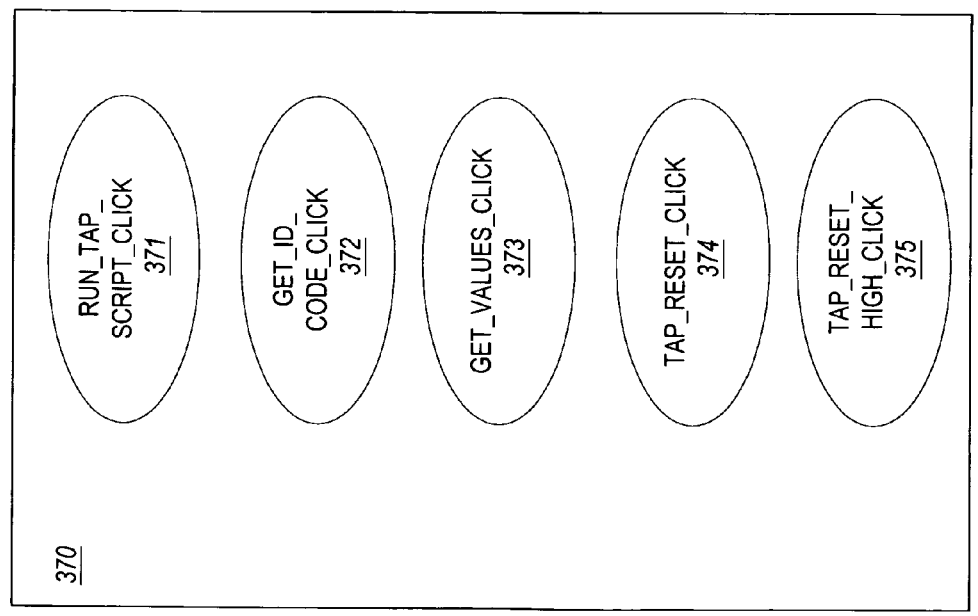
FIG. 5C is a software layout diagram of a DUT control module that interfaces with the GUI I/O module of FIG. 5B.

FIG. 5B is a software layout diagram illustrating a GUI I/O module 350 that may generate the GUI display 300. As shown therein, the GUI I/O module 350 includes a number of subroutines that generate the display, including a Display_Window routine 351 which generates the window 300, a display_Run_Tap_Script_button 352 which generates the Run_TAP_Script button 302, display_Get_ID_Code_button 353 which generates the Get_ID_Code button 304, display_Get_Values_button 354 which generates the Get_Values button 306, display_TAP_Reset_button 355 which generates the TAP_Reset button 308, and display_TAP_Reset_High_button 356 which generates the TAP_Reset_High button 310. The GUI I/O module 350 also includes a get_Run_Tap_Script_button_click routine 357, a get_Tap_Script_content routine 358, a get_Get_ID_Code_button_click routine 359, a get_Get_Values_button_click routine 360, a get_TAP_Reset_button_click routine 361, and a get_TAP_Reset_High_button_click routine 362. These routines 357, 358, 359, 360, 361, and 363 monitor activation of the buttons by the user, and transfer control to corresponding subroutines in the DUT control module 370 (FIG. 5C). The GUI display and input routines are implemented using standard GUI technology, which are well-known by those skilled in the art of GUI design. Additional routines not shown implement the pin and port configuration functionality.

FIG. 5C illustrates a DUT control module 370 that interfaces with the GUI I/O module 350. The DUT control module 370 includes a number of subroutines that are generally activated by corresponding get_"x"_button_click routines (where "x" is the name of the button clicked by the user) in the GUI I/O control module 360. These subroutines include a Run_Tap_Script_Click routine 371 that is activated by the get$_{13}$ Run_Tap_Script_button_click routine 357 (or, depending on the implementation, by the Get_TAP_Script_Content routine 358), a Get_ID_Code_Click routine 372 that is activated by the get_Get_ID_Code_button_click routine 359, a Get_Values_Click routine 373 that is activated by the get_Get_Values_Button_Click routine 360, a TAP_Reset_Click routine 374 that is activated by the get_TAP_Reset_button_click routine 361, and a TAP_Reset_High_Click 375 routine that is activated by the get_TAP_Reset_High_button_click routine 362 of the GUI I/O software module 350.

Example code is listed in Appendix A illustrating Visual Basic source code for one example implementation of the DUT control module.

Figure 6:
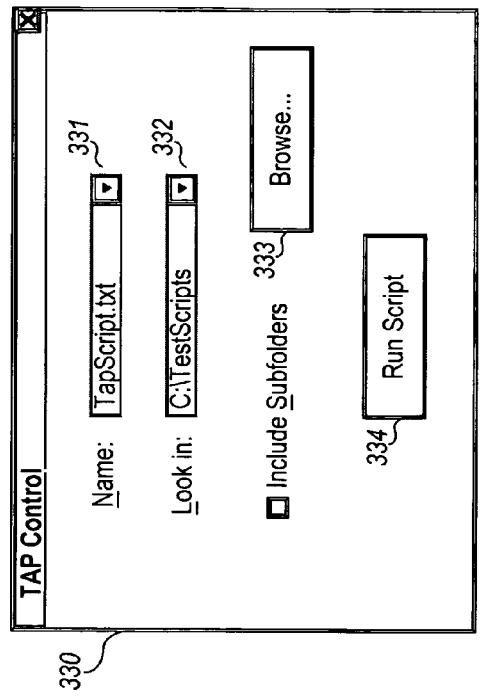
FIG. 6 is an example of a GUI dialog box display for obtaining a TAP Script file.

In operation, when a button is activated, for example via a mouse click, a corresponding GUI I/O function is performed. In particular, when the Run_Tap_Script 302 button on the GUI display 300 is activated by the user, a dialog box 330, shown in FIG. 6, pops up (under the control of the get_TAP_Script_Content routine 358 of the GUI I/O module 350) requesting the user to select a test/control vector file for execution. The dialog box 330 includes a TAP Script name box 331, a directory name box 332, a Browse button 333, and a Run Script button 334. The user may enter the filename of the TAP script file and the directory in which the TAP script file resides in the TAP Script name box 331 and directory name box 332, respectively. Alternatively, the user may activate the Browse button 333, for example via a mouse click, to view further dialog for locating the desired TAP script file in the computer file system. When the desired Script file and directory are respectively entered in the TAP Script name box 331 and directory name box 332, the user then activates the Run Script button 334, for example via a mouse click, to activate the underlying GUI I/O and DUT control software.

Activation of the Run Script button 334 transfers control of the process to the Run_TAP_Script_Click routine 371 of the DUT control module 370. Code for this routine is shown in Appendix A, indicated as subroutine "sub Run_TAP Script_Port1_Click( )". As shown therein, test vectors are read in as lines of text from the selected test vector file. These lines are in the form of 4 or 5 bits, each bit corresponding to the TCK, TMS, TDI, TDO, and TRST (if present) bits of the TAP. The test vectors lines are processed one by one and written to the parallel port on the pins as configured by the selected pin and port configuration boxes 314, 316, 318, 320, 322, and 324 of the GUI 300. The clock signal TCK is toggled between each write to the parallel port.

The results of this script (if any) will be stored in the results window 312 of the GUI display 300. These vector files are preferably generated by the integrated circuit manufacturer, and may comprise the same functional tests used to verify proper operation of the integrated circuit during manufacturing test. In this regard, the IC testers may be configured to generate TAM test vectors in addition to the tester test vectors which typically comprise values of each of a large number of tester interface pins (also called a "bed-of-nails") that are applied to nodes of the integrated circuit under test when the integrated circuit is mounted in the tester. For example, the Agilent F330 or 98000 series tester, manufactured by Agilent technologies, Inc. of Palo Alto, Calif., provides functionality for generating test vectors in a file format to be run in the PTAP program are also generated. This allows the test vector generation team to send the customer test(s) that can also be executed by the manufacturer on an Agilent tester.

When the Get_ID_Code 304 button on the GUI display 300 is activated by the user, the get_Get_ID_Code_button_click routine 359 of the GUI I/O module 350 detects the click and transfers control of the process to the Get_ID_Code_Click routine 372 of the DUT control module 370. Code for this routine is shown in Appendix A, indicated as subroutine "sub ID_Code_Port1_Click( )". In this routine, TAP control signals are generated to instruct the TAP to obtain an identification code hardcoded in the integrated circuit and display it for the user. In this regard, it is common practice to implement a hardcoded identification code (for example, according to an industry standard JEDEC 32 bit identification code) in integrated circuits. Display of the ID Code of the particular integrated circuit of interest in the window 312 of the GUI display 300 allows the user to verify several things: (1) the IC in question is properly powered up; (2) the parallel port of the system under test is working correctly; and (3) the cable connecting the computer to the system under test is working correctly.

When the Get_Values 306 button on the GUI display 300 is activated by the user, the get_Get_Values_button_click routine 360 of the GUI I/O module 350 detects the click and transfers control of the process to the Get_Values_Click routine 373 of the DUT control module 370. Code for this routine is shown in Appendix A, indicated as subroutine "sub get_values_click( )". In this routine, the DUT control module 370 returns an integer signifying the current state of the parallel port's pins, which may be helpful for debugging purposes. The results are displayed in the results window 312 of the GUI display 300.

When the TAP_Reset 308 button on the GUI display 300 is activated by the user, the get_Get_TAP_Reset_button_click routine 361 of the GUI I/O module 350 detects the click and transfers control of the process to the Get_TAP_Reset_Click routine 374 of the DUT control module 370. Code for this routine is shown in Appendix A, indicated as subroutine "sub Tap_reset_click( )". In this routine, the DUT control module 370 writes a vector to reset the TAM to a predefined initial state.

When the TAP_Reset_High 310 button on the GUI display 300 is activated by the user, the get_Get_TAP_Reset_High_button_click routine 362 of the GUI I/O module 350 detects the click and transfers control of the process to the Get_TAP_Reset_High_Click routine 375 of the DUT control module 370. Code for this routine is shown in Appendix A, indicated as subroutine "sub Tap_reset_high_click( )". In this routine, the DUT control module 370 writes a vector to toggle a previously set low value of the TSRT port to bring the TAM out of reset mode.

From the above detailed description, it is clear that the present invention provides many advantages over the prior art. By implementing a TAM and DFT structures within the integrated circuit and connecting the TAM ports to a parallel port of the system in which the integrated circuit is installed, the invention allows test/control data to be downloaded to and test results returned from the integrated circuit without removing the integrated circuit from the system. Functional tests developed by the manufacturer can then be applied to the IC of interest and results of the test can be obtained without the need for expensive testers, reducing the requirements of the test station to a simple computer (such as a common personal computer or laptop) equipped with a parallel port or other communications (e.g., wireless) interface.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. For example, it should be understood that the term the communications interface as used in both the specification and the claims includes any interface that passes test vectors between the test station computer and the system under test such that the TAM test vectors are applied to and/or received from the signal ports of the TAM. It is also possible that other benefits or uses of the currently disclosed invention will become apparent over time.

APPENDIX A

```
Option Explicit
Dim starttime As Variant
Dim endtime As Variant
Dim elapsedtime As Variant
Dim Result As Boolean
Private Declare Sub Sleep Lib "kernel32" (ByVal dwMilliseconds As Long)
Private Sub Exit_Click( )
```

APPENDIX A-continued

```
Unload Me
End Sub
Private Sub Id_code_port1_Click( )
Dim filename As String
Dim lineoftext As String
Dim Result As Boolean
Dim PortVal1 As Long
Dim bit_count As Long
Dim idcode_all1 As String
Dim I As Integer
Dim len_line As Long
Open "read_idcode.ascii_data" For Input As #1
    tck = "0"
    tms = "0"
    tdi = "0"
    trst = "1" 'trst = 1
    write_val tck, tdi, trst, tms
    tck = "1"
    write_val tck, tdi, trst, tms
    tck = "0"
    write_val tck, tdi, trst, tms
    bit_count = 1
Do Until EOF(1)
    Line Input #1, lineoftext
    len_line = Len(lineoftext)
    If Len(lineoftext) > 3 And Len(lineoftext) < 6 Then
        tck = Mid(lineoftext, 1, 1)
        tms = Mid(lineoftext, 2, 1)
        tdi = Mid(lineoftext, 3, 1)
        tdo = Mid(lineoftext, 4, 1)
        If Len(lineoftext) = 5 Then
            trst = Mid(lineoftext, 5, 1)
        End If
        If tck = "1" Then ' toggle tck
            tck = "0"
            write_val tck, tdi, trst, tms
            tck = "1"
        End If            ' toggle tck
        write_val tck, tdi, trst, tms
        If tdo = "L" Or tdo = "l" Or tdo = "H" Or tdo = "h" Then ' H,h,L,l signals
tdo data
            idcode1(bit_count) = read_val( )
            bit_count = bit_count + 1
        End If
    End If
Loop
idcode_all1 = " "
For I = 1 To 32
    idcode_all1 = idcode_all1 + idcode1(I)
Next I
'List1.AddItem idcode_all1
'List1.ListIndex = List1.ListCount − 1
Text1 = Text1 + "IDCODE: " + idcode_all1 + vbNewLine
Text1.SelStart = Len(Text1.Text)
Close #1
Open "c:\ptap.txt" For Append As 2
Print #2, idcode_all1
Close #2
End Sub
Private Sub Delay(DelaySeconds As Single)
 Do While DelaySeconds > 1
  Sleep (1000)
  DelaySeconds = DelaySeconds − 1
 Loop
End Sub
Private Sub run_tap_script_port1_Click( )
Dim filename As String
Dim lineoftext As String
Dim Result As Boolean
Dim PortVal1, PortVal As Long
Dim len_line As Long
Dim bit_count As Long
Dim idcode_all1, idcode As String
Dim I As Integer
bit_count = 1
CommonDialog1.Filter = "ASCII Files (*.ascii_data)|*.ascii_data"
CommonDialog1.ShowOpen
If CommonDialog1.filename <> " " Then
    'Open filename$ For Input As #1
```

APPENDIX A-continued

```
    Open CommonDialog1.filename For Input As #1
'format of ascii_data
'    tck,tms,tdi,tdo,trst_I or
'    tck,tms,tdi,tdo
      len_line = 0
      tck = "0"
      tms = "0"
      tdi = "0"
      trst = "1" 'trst = 1
      write_val tck, tdi, trst, tms
      tck = "1"
      write_val tck, tdi, trst, tms
      tck = "0"
      write_val tck, tdi, trst, tms
      Do Until EOF(1)
              Screen.MousePointer = vbHourglass
          lineoftext = " "
          Line Input #1, lineoftext
          len_line = Len(lineoftext)
          If Len(lineoftext) > 3 And Len(lineoftext) < 6 Then
              tck = Mid(lineoftext, 1, 1)
              tms = Mid(lineoftext, 2, 1)
              tdi = Mid(lineoftext, 3, 1)
              tdo = Mid(lineoftext, 4, 1)
              If Len(lineoftext) = 5 Then
                  trst = Mid(lineoftext, 5, 1)
                  'Text1 = Text1 + "TRST: " + trst + vbNewLine
                  'Text1.SelStart = Len(Text1.Text)
              End If
              If tck = "1" Then ' toggle tck
                  tck = "0"
                  write_val tck, tdi, trst, tms
                  tck = "1"
              End If              ' toggle tck
              write_val tck, tdi, trst, tms
              If tdo = "L" Or tdo = "l" Or tdo = "H" Or tdo = "h" Then ' H,h,L,l signals
tdo data
                  idcode = idcode + read_val( )
              End If
          End If
      Loop
      Close #1
      'List1.AddItem idcode
      'List1.ListIndex = List1.ListCount − 1
      Text1 = Text1 + CommonDialog1.FileTitle + ": " + idcode + vbNewLine
      Text1.SelStart = Len(Text1.Text)
      Screen.MousePointer = vbDefault
      Debug.Print "finished reading"
        Open "c:\ptap.txt" For Append As 2
        Print #2, idcode
        Close #2
End If
End Sub
Private Sub Form_Load( )
Dim s1 As String
tms_address.ListIndex = 0
trst_address.ListIndex = 1
tdi_address.ListIndex = 2
tck_address.ListIndex = 3
tdo_address.ListIndex = 0
parallel_address.ListIndex = 0
    If InitializeWinIo = False Then
      MsgBox "There is a problem with InitializeWinIo.", vbOKOnly + vbCritical,
"ptap_tdo"
      Unload Main
    Else
    'Call BtnGet_Click
    End If
End Sub
Private Sub Form_Unload(Cancel As Integer)
    Call ShutdownWinIo
End Sub
Private Sub BtnQuit_Click( )
    Unload Main
End Sub
Private Sub BtnSet_Click( )
    Dim Result As Boolean
    'Result = SetPortVal(Val("&H378"), Val("&H" + TxtPortByte), 1)
    If (Result = False) Then
```

APPENDIX A-continued

```
        MsgBox "Whoops ! There is a problem with SetPortByte.", vbOKOnly +
vbCritical, "VBDumpPort32"
        Unload Main
    End If
End Sub
Private Sub Tap_reset_Click( )
Dim Result As Boolean
        tms = "0"
        trst = "0"
        tdi = "0"
        tck = "0"
        tdo = "0"
        'Debug.Print Val((tck * 8) + (tdi * 4) + (trst * 2) + (tms))
        write_val tck, tdi, trst, tms
        Text1 = Text1 + "The TAP is now held in reset (TRST_L=0). TRST_L will
go high when another test is run. " + vbNewLine
        Text1.SelStart = Len(Text1.Text)
End Sub
Private Sub tap_reset_high_Click( )
    tms = "0"
        trst = "1"
        tdi = "0"
        tck = "0"
        tdo = "0"
        'Debug.Print Val((tck * 8) + (tdi * 4) + (trst * 2) + (tms))
        write_val tck, tdi, trst, tms
        Dim idcode As Long
        Text1 = Text1 + "The TAP is out of reset (TSRT_L=1). " + vbNewLine
        Text1.SelStart = Len(Text1.Text)
End Sub
Private Sub write_val(tck, tdi, trst, tms)
        Dim tck_a As Integer
        Dim tdi_a As Integer
        Dim trst_a As Integer
        Dim tms_a As Integer
        Dim address As String
        tck_a = 2 ^ tck_address.ListIndex
        tdi_a = 2 ^ tdi_address.ListIndex
        trst_a = 2 ^ trst_address.ListIndex
        tms_a = 2 ^ tms_address.ListIndex
        address = "&H" + parallel_address
        Result = SetPortVal(Val(address), Val((tck * tck_a) + (tdi * tdi_a) + (trst *
trst_a) + (tms * tms_a)), 1)
End Sub
Private Function read_val( ) As String
        Dim PortVal1 As Long
        Dim address As String
        address = "&H" + Str(Int(parallel_address) + 1)
        Result = GetPortVal(Val(address), PortVal1, 1)
        " RxPortByte1 = Hex$(PortVal1 And &H20) ' bit 5 Paper out status bit
        If tdo_address.ListIndex = 0 Then RxPortByte1 = Hex$(PortVal1 And
& H20) ' bit 5
        If tdo_address.ListIndex = 1 Then RxPortByte1 = Hex$(PortVal1 And
&H40) ' bit 6
        If RxPortByte1 > 0 Then
            read_val = 1
        Else
            read_val = 0
        End If
End Function
Private Sub get_values_Click( )
        Dim Result As String
        Dim PortVal1 As Long
        Dim address As String
        Dim address_int As Integer
        address = "&H" + Str(Int(parallel_address) + 1)
        Result = GetPortVal(Val(address), PortVal1, 1)
        'List1.AddItem PortVal1
        'List1.ListIndex = List1.ListCount – 1
        Text1 = Text1 + "Parallel Port Value: " + Str(PortVal1) + vbNewLine
        Text1.SelStart = Len(Text1.Text)
End Sub
```

What is claimed is:

1. A method for remotely controlling an integrated circuit installed in a remote system, the integrated circuit comprising one or more functional blocks, one or more test structures configured to test said one or more functional blocks, and a test access mechanism which processes test access mechanism input vectors received on corresponding respective signal ports of the test access mechanism to control the one or more test structures, the method comprising the steps of:

obtaining, via a computer, a first set of test access mechanism signal vectors each comprising a set of respective data and/or control values to be applied to the corresponding respective signal ports of the test access mechanism of the integrated circuit installed in the remote system;

transmitting, via a first communications interface in the computer, the first set of test access mechanism signal vectors to a second communications interface in the remote system, the second communications interface operating to effect application of the first set of test access mechanism signal vectors to the corresponding respective signal ports of the test access mechanism of the integrated circuit; and receiving, via the first communications interface in the computer, a second set of test access mechanism signal vectors comprising test result data output onto said the corresponding respective signal ports of the test access mechanism of the integrated circuit and transmitted to the first communications interface of the computer by the second communications interface of the remote system.

2. The method of claim 1, wherein:

the first set of test access mechanism signal vectors comprises a functional test suite that tests functionality of the one or more functional blocks of the integrated circuit.

3. The method of claim 1, wherein:

the transmitting step comprises:

writing, via the computer, the first set of test access mechanism signal vectors to a first set of respective pins of a first parallel port of the computer, the first set of respective pins of the first parallel port connected via a parallel cable to a corresponding second set of respective pins of a second parallel port, the second set of respective pins of the second parallel port connected to the corresponding respective signal ports of the test access mechanism of the integrated circuit; and the receiving step comprises:

reading the second set of test access mechanism signal vectors from the first set of respective pins of the first parallel port of the computer, the second set of test access mechanism signal vectors comprising test result data output onto said the corresponding respective signal ports of the test access mechanism of the integrated circuit.

4. The method of claim 1, wherein the obtaining step comprises:

presenting a graphical user interface to a user, the graphical user interface providing means to input the first set of test access mechanism signal vectors; and receiving the first set of test access mechanism signal vectors input by the user.

5. The method of claim 4, wherein:

the first set of test access mechanism signal vectors comprises a functional test suite that tests functionality of the one or more functional blocks of the integrated circuit.

6. A computer readable storage medium tangibly embodying program instructions implementing a method for remotely controlling an integrated circuit installed in a remote system, the integrated circuit comprising one or more functional blocks, one or more test structures configured to test said one or more functional blocks, and a test access mechanism which processes test access mechanism input vectors received on corresponding respective signal ports of the test access mechanism to control the one or more test structures, the method comprising the steps of:

obtaining, via a computer, a first set of test access mechanism signal vectors each comprising a set of respective data and/or control values to be applied to the corresponding respective signal ports of the test access mechanism of the integrated circuit installed in the remote system;

transmitting, via a first communications interface in the computer, the first set of test access mechanism signal vectors to a second communications interface in the remote system, the second communications interface operating to effect application of the first set of test access mechanism signal vectors to the corresponding respective signal ports of the test access mechanism of the integrated circuit; and receiving, via the first communications interface in the computer, a second set of test access mechanism signal vectors comprising test result data output onto said the corresponding respective signal ports of the test access mechanism of the integrated circuit and transmitted to the first communications interface of the computer by the second communications interface of the remote system.

7. The computer readable storage medium of claim 6, wherein:

the first set of test access mechanism signal vectors comprises a functional test suite that tests functionality of the one or more functional blocks of the integrated circuit.

8. The computer readable storage medium of claim 6, wherein:

the transmitting step comprises:

writing, via the computer, the first set of test access mechanism signal vectors to a first set of respective pins of a first parallel port of the computer, the first set of respective pins of the first parallel port connected via a parallel cable to a corresponding second set of respective pins of a second parallel port, the second set of respective pins of the second parallel port connected to the corresponding respective signal ports of the test access mechanism of the integrated circuit; and the receiving step comprises:

reading the second set of test access mechanism signal vectors from the first set of respective pins of the first parallel port of the computer, the second set of test access mechanism signal vectors comprising test result data output onto said the corresponding respective signal ports of the test access mechanism of the integrated circuit.

9. The computer readable storage medium of claim 6, wherein the obtaining step comprises:

presenting a graphical user interface to a user, the graphical user interface providing means to input the first set of test access mechanism signal vectors; and receiving the first set of test access mechanism signal vectors input by the user.

10. The computer readable storage medium of claim 9, wherein:

the first set of test access mechanism signal vectors comprises a functional test suite that tests functionality of the one or more functional blocks of the integrated circuit.

11. An apparatus for remotely controlling an integrated circuit installed in a remote system, the integrated circuit comprising one or more functional blocks, one or more test structures configured to test said one or more functional blocks, and a test access mechanism which processes test access mechanism input vectors received on corresponding respective signal ports of the test access mechanism to control the one or more test structures, the apparatus comprising:

a first communications interface operable to communicate with a second communications interface installed in the remote system, the second communications interface operable to apply test access mechanism input vectors received from said first communications interface to the corresponding respective signal ports of the test access mechanism of the integrated circuit;

a memory;

a program stored in the memory, the program comprising program instructions for performing a method comprising the steps of:

obtaining a first set of test access mechanism signal vectors each comprising a set of respective data and/or control values to be applied to the corresponding respective test access mechanism signal ports of the test access mechanism of the integrated circuit installed in the remote system;

transmitting, via the first communications interface in the computer, the first set of test access mechanism signal vectors to the second communications interface in the remote system; and receiving, via the first communications interface in the computer, a second set of test access mechanism signal vectors comprising test result data output onto said the corresponding respective signal ports of the test access mechanism of the integrated circuit and transmitted to the first communications interface of the computer by the second communications interface of the remote system; and a processor which executes the program stored in the memory.

12. The apparatus of claim 11, wherein:

the first set of test access mechanism signal vectors comprises a functional test suite that tests functionality of the one or more functional blocks of the integrated circuit.

13. The apparatus of claim 11, wherein:

the transmitting step comprises:

writing, via the computer, the first set of test access mechanism signal vectors to a first set of respective pins of a first parallel port of the computer, the first set of respective pins of the first parallel port connected via a parallel cable to a corresponding second set of respective pins of a second parallel port, the second set of respective pins of the second parallel port connected to the corresponding respective signal ports of the test access mechanism of the integrated circuit; and the receiving step comprises:

reading the second set of test access mechanism signal vectors from the first set of respective pins of the first parallel port of the computer, the second set of test access mechanism signal vectors comprising test result data output onto said the corresponding respective signal ports of the test access mechanism of the integrated circuit.

14. The apparatus of claim 11, wherein the obtaining step comprises:

presenting a graphical user interface to a user, the graphical user interface providing means to input the first set of test access mechanism signal vectors; and receiving the first set of test access mechanism signal vectors input by the user.

15. The apparatus of claim 14, wherein:

the first set of test access mechanism signal vectors comprises a functional test suite that tests functionality of the one or more functional blocks of the integrated circuit.

16. A method for remotely controlling an integrated circuit installed in a remote system, the integrated circuit comprising one or more functional blocks, one or more test structures configured to test said one or more functional blocks, and a test access mechanism which processes test access mechanism input vectors received on corresponding respective signal ports of the test access mechanism to control the one or more test structures, the method comprising the steps of:

obtaining, via a computer, a first set of test access mechanism signal vectors each comprising a set of respective data and/or control values to be applied to the corresponding respective signal ports of the test access mechanism of the integrated circuit installed in the remote system;

writing, via the computer, the first set of test access mechanism signal vectors to a first set of respective pins of a first parallel port of the computer, the first set of respective pins of the first parallel port connected via a parallel cable to a corresponding second set of respective pins of a second parallel port, the second set of respective pins of the second parallel port connected to the corresponding respective signal ports of the test access mechanism of the integrated circuit; and reading a second set of test access mechanism signal vectors from the first set of respective pins of the first parallel port of the computer, the second set of test access mechanism signal vectors comprising test result data output onto said the corresponding respective signal ports of the test access mechanism of the integrated circuit.

17. The method of claim 16, wherein:

the first set of test access mechanism signal vectors comprises a functional test suite that tests functionality of the one or more functional blocks of the integrated circuit.

18. A computer readable storage medium tangibly embodying program instructions implementing a method for remotely controlling an integrated circuit installed in a remote system, the integrated circuit comprising one or more functional blocks, one or more test structures configured to test said one or more functional blocks, and a test access mechanism which processes test access mechanism input vectors received on corresponding respective signal ports of the test access mechanism to control the one or more test structures, the method comprising the steps of:
- obtaining, via a computer, a first set of test access mechanism signal vectors each comprising a set of respective data and/or control values to be applied to the corresponding respective signal ports of the test access mechanism of the integrated circuit installed in the remote system;
- writing, via the computer, the first set of test access mechanism signal vectors to a first set of respective pins of a first parallel port of the computer, the first set of respective pins of the first parallel port connected via a parallel cable to a corresponding second set of respective pins of a second parallel port, the second set of respective pins of the second parallel port connected to the corresponding respective signal ports of the test access mechanism of the integrated circuit; and
- reading a second set of test access mechanism signal vectors from the first set of respective pins of the first parallel port of the computer, the second set of test access mechanism signal vectors comprising test result data output onto said the corresponding respective signal ports of the test access mechanism of the integrated circuit.

19. The computer readable storage medium of claim 18, wherein:
- the first set of test access mechanism signal vectors comprises a functional test suite that tests functionality of the one or more functional blocks of the integrated circuit.

20. An apparatus for remotely controlling an integrated circuit installed in a remote system, the integrated circuit comprising one or more functional blocks, one or more test structures configured to test said one or more functional blocks, and a test access mechanism which processes test access mechanism input vectors received on corresponding respective signal ports of the test access mechanism to control the one or more test structures, the apparatus comprising:
- a first parallel port comprising a first set of respective pins that are connectable via a parallel cable to a corresponding second set of respective pins of a second parallel port installed in the remote system, the second set of respective pins of the second parallel port connected to the corresponding respective signal ports of the test access mechanism of the integrated circuit;
- a memory;
- a program stored in the memory, the program comprising program instructions for performing a method comprising the steps of:
  - obtaining a first set of test access mechanism signal vectors each comprising a set of respective data and/or control values to be applied to the corresponding respective test access mechanism signal ports of the test access mechanism of the integrated circuit installed in the remote system;
  - writing the first set of test access mechanism signal vectors to the first set of respective pins of the first parallel port; and
  - reading a second set of test access mechanism signal vectors from the first set of respective pins of the first parallel port of the computer, the second set of test access mechanism signal vectors comprising test result data output onto said the corresponding respective signal ports of the test access mechanism of the integrated circuit; and
- a processor which executes the program stored in the memory.

* * * * *